United States Patent
Pillarisetty et al.

(10) Patent No.: US 8,022,487 B2
(45) Date of Patent: Sep. 20, 2011

(54) INCREASING BODY DOPANT UNIFORMITY IN MULTI-GATE TRANSISTOR DEVICES

(75) Inventors: Ravi Pillarisetty, Portland, OR (US); Jack T. Kavalieros, Portland, OR (US); Titash Rakshit, Hillsboro, OR (US); Gilbert Dewey, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 599 days.

(21) Appl. No.: 12/111,714

(22) Filed: Apr. 29, 2008

(65) Prior Publication Data

US 2009/0267161 A1 Oct. 29, 2009

(51) Int. Cl.
*H01L 21/00* (2006.01)

(52) U.S. Cl. .................. 257/402; 257/190; 257/192

(58) Field of Classification Search .................. 257/402, 257/190, 192
See application file for complete search history.

(56) References Cited

U.S. PATENT DOCUMENTS

| | | | |
|---|---|---|---|
| 6,764,884 B1 * | 7/2004 | Yu et al. | 438/157 |
| 6,858,478 B2 | 2/2005 | Chau | |
| 6,914,295 B2 | 7/2005 | Chau | |
| 7,005,366 B2 | 2/2006 | Chau | |
| 7,208,361 B2 | 4/2007 | Shah | |
| 7,217,611 B2 | 5/2007 | Kavalieros | |
| 7,253,060 B2 * | 8/2007 | Yun et al. | 438/284 |
| 7,358,121 B2 | 4/2008 | Chau | |
| 7,361,958 B2 * | 4/2008 | Brask et al. | 257/369 |
| 7,449,373 B2 * | 11/2008 | Doyle et al. | 438/149 |
| 7,528,025 B2 * | 5/2009 | Brask et al. | 438/183 |
| 7,531,437 B2 * | 5/2009 | Brask et al. | 438/585 |
| 7,585,734 B2 * | 9/2009 | Kang et al. | 438/283 |
| 7,646,071 B2 * | 1/2010 | Ban et al. | 257/404 |
| 7,652,308 B2 * | 1/2010 | Park et al. | 257/175 |
| 7,704,835 B2 * | 4/2010 | Singh et al. | 438/267 |
| 7,745,270 B2 * | 6/2010 | Shah et al. | 438/157 |
| 7,777,282 B2 * | 8/2010 | Majhi et al. | 257/401 |
| 7,915,642 B2 * | 3/2011 | Pillarisetty et al. | 257/192 |
| 2004/0007724 A1 | 1/2004 | Murthy | |
| 2005/0269644 A1 | 12/2005 | Brask | |
| 2005/0272191 A1 | 12/2005 | Shah | |
| 2005/0287746 A1 | 12/2005 | Metz | |
| 2006/0003499 A1 | 1/2006 | Doczy | |
| 2006/0071275 A1 * | 4/2006 | Brask et al. | 257/350 |

(Continued)

OTHER PUBLICATIONS

U.S. Appl. No. 11/731,266, filed Mar. 29, 2007.

(Continued)

*Primary Examiner* — Laura Menz
(74) *Attorney, Agent, or Firm* — Cool Patent, P.C.; Joseph P. Curtin

(57) ABSTRACT

Techniques and structures for increasing body dopant uniformity in multi-gate transistor devices are generally described. In one example, an electronic device includes a semiconductor substrate, a multi-gate fin coupled with the semiconductor substrate, the multi-gate fin comprising a source region, a drain region, and a gate region wherein the gate region is disposed between the source region and the drain region, the gate region being body-doped after a sacrificial gate structure is removed from the multi-gate fin and before a subsequent gate structure is formed, a dielectric material coupled with the source region and the drain region of the multi-gate fin, and the subsequent gate structure coupled to the gate region of the multi-gate fin.

7 Claims, 4 Drawing Sheets

U.S. PATENT DOCUMENTS

| | | | |
|---|---|---|---|
| 2006/0138552 A1* | 6/2006 | Brask et al. | 257/369 |
| 2007/0152266 A1* | 7/2007 | Doyle et al. | 257/327 |
| 2007/0238273 A1* | 10/2007 | Doyle et al. | 438/525 |
| 2008/0085580 A1 | 4/2008 | Doyle | |
| 2008/0090348 A1* | 4/2008 | Chang et al. | 438/199 |
| 2008/0090397 A1* | 4/2008 | Brask et al. | 438/592 |
| 2008/0135894 A1 | 6/2008 | Bohr | |
| 2008/0135952 A1 | 6/2008 | Brask | |
| 2009/0078982 A1* | 3/2009 | Rachmady et al. | 257/315 |
| 2009/0149012 A1* | 6/2009 | Brask et al. | 438/595 |
| 2009/0230478 A1* | 9/2009 | Pillarisetty et al. | 257/365 |
| 2009/0267161 A1* | 10/2009 | Pillarisetty et al. | 257/402 |
| 2009/0272967 A1* | 11/2009 | Afzali-Ardakani et al. | 257/40 |
| 2010/0025775 A1* | 2/2010 | Giles et al. | 257/386 |
| 2010/0032763 A1* | 2/2010 | Pillarisetty et al. | 257/366 |
| 2010/0038713 A1* | 2/2010 | Majhi et al. | 257/344 |
| 2010/0072533 A1* | 3/2010 | Ban et al. | 257/314 |
| 2010/0163926 A1* | 7/2010 | Hudait et al. | 257/190 |
| 2010/0163927 A1* | 7/2010 | Pillarisetty et al. | 257/194 |
| 2010/0163970 A1* | 7/2010 | Rakshit et al. | 257/327 |
| 2010/0230658 A1* | 9/2010 | Pillarisetty et al. | 257/14 |

OTHER PUBLICATIONS

U.S. Appl. No. 11/647,989, filed Dec. 29, 2006.
U.S. Appl. No. 11/729,198, filed Mar. 28, 2007.
U.S. Appl. No. 11/765,023, filed Jun. 19, 2007.
U.S. Appl. No. 11/948,414, filed Nov. 30, 2007.
U.S. Appl. No. 11/964,623, filed Dec. 26, 2007.
U.S. Appl. No. 12/032,588, filed Feb. 15, 2008.
U.S. Appl. No. 11/964,593, filed Dec. 26, 2007.
U.S. Appl. No. 11/964,633, filed Dec. 26, 2007.

* cited by examiner

INCREASING BODY DOPANT UNIFORMITY IN MULTI-GATE TRANSISTOR DEVICES

BACKGROUND

Generally, body doping may modulate a threshold voltage ($V_t$) for a multi-gate transistor. Thermal processes including, for example, temperatures greater than about 400° C. may cause significant segregation of dopants that decrease the body dopant uniformity of a multi-gate transistor.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
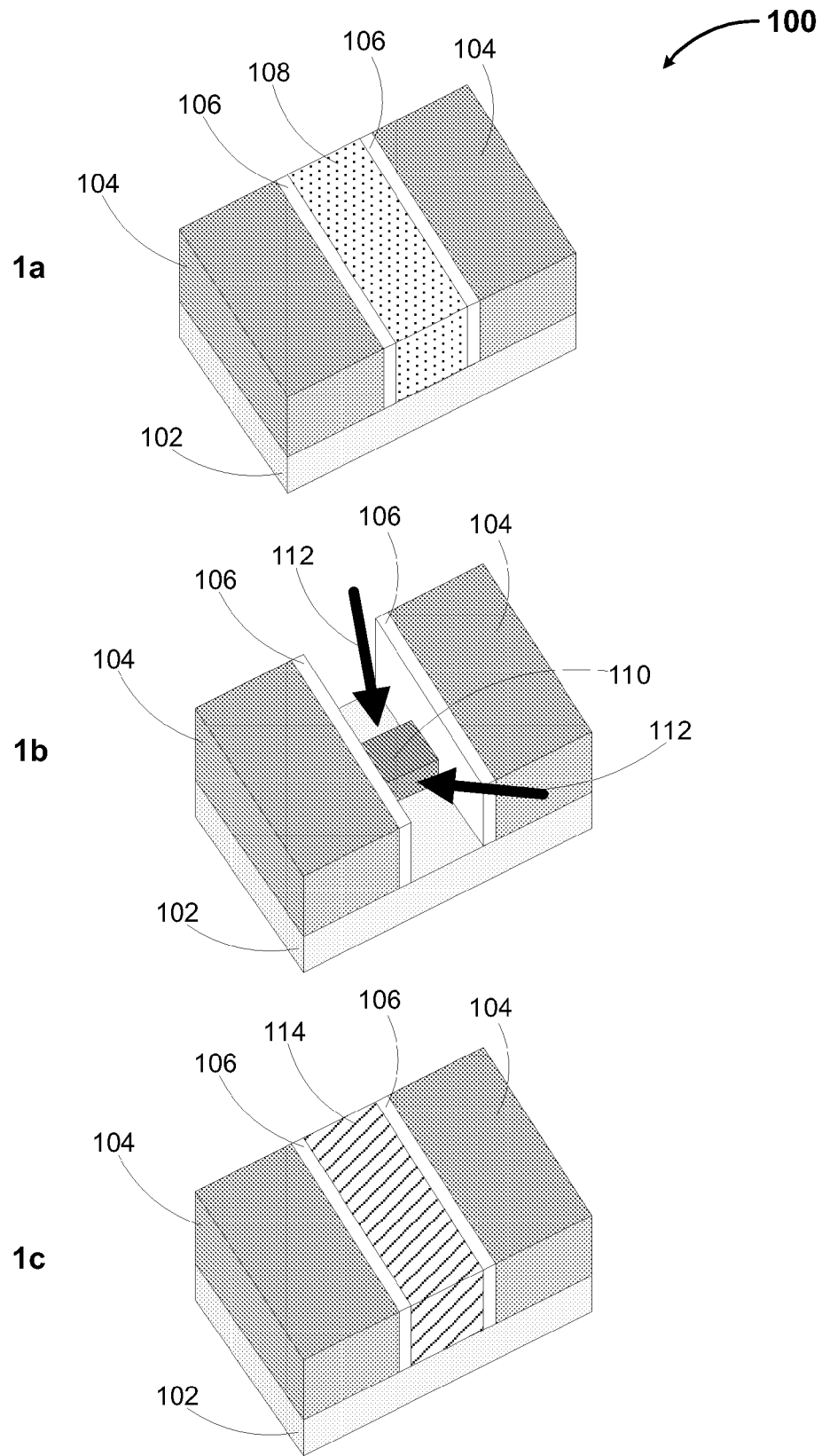
FIG. 1 is a cross-section schematic of a technique to increase body dopant uniformity in a multi-gate electronic device, according to but one embodiment.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of increasing body dopant uniformity in multi-gate transistor devices are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

FIG. 1 is a cross-section schematic of a technique to increase body dopant uniformity in a multi-gate electronic device, according to but one embodiment. In an embodiment according to FIG. 1a, an electronic device 100 comprises a semiconductor substrate 102, a dielectric material 104, a spacer structure 106, and a sacrificial gate structure 108, coupled as shown. One or more multi-gate fins 110 or pillars may be coupled to the semiconductor substrate 102 as depicted in FIG. 1b, but may be covered by dielectric material 104, spacer structure 106, and sacrificial gate structure 108 in FIG. 1a.

Semiconductor substrate 102 may comprise silicon (Si) in an embodiment. In other embodiments, semiconductor substrate 102 includes any suitable semiconductor material for fabricating a multi-gate electronic device 100. Dielectric material 104 may comprise silicon oxide ($SiO_2$) in an embodiment. In other embodiments, dielectric material 104 includes any suitable dielectric material for fabricating a multi-gate electronic device 100. Spacer structure 106 may comprise silicon nitride (SiN) in an embodiment. In other embodiments, spacer structure 106 includes any suitable spacer material for fabricating a multi-gate electronic device 100.

FIG. 1a may depict a multi-gate or other non-planar electronic device 100 that is formed by a process that incorporates a sacrificial gate structure 108 such as a replacement metal gate (RMG) process. A sacrificial gate structure 108 may be formed on a multi-gate fin 110. In an embodiment, a sacrificial gate structure 108 comprises a sacrificial gate dielectric coupled to a multi-gate fin 110 and a sacrificial gate electrode coupled to the sacrificial gate dielectric. In another embodiment, a sacrificial gate structure 108 comprises a sacrificial gate dielectric comprising an oxide and a sacrificial gate electrode comprising polysilicon.

Referring now to FIG. 1b, sacrificial gate structure 108 is removed to expose an underlying multi-gate fin 110 to allow body doping 112 of the multi-gate fin 110. Sacrificial gate structure 108 may be removed by an etch process or any other suitable removal method. In an embodiment according to FIG. 1b, an electronic device 100 comprises semiconductor substrate 102, dielectric material 104, spacer structure 106, and multi-gate fin 110, coupled as shown. Arrows 112 may depict a body doping implant 112.

Multi-gate fin 110 may comprise a source region, a drain region, and a gate region wherein the gate region is disposed between the source region and the drain region. In an embodiment, the gate region of multi-gate fin 110 comprises the region that is exposed after removal of the sacrificial gate structure 108. Dielectric material 104 may be coupled with the source region and the drain region of multi-gate fin 110.

In an embodiment, the gate region of multi-gate fin 110 receives a body doping implant 112 after removal of the sacrificial gate structure 108 and before a subsequent gate structure 114 is formed. Body doping 112 may be used to set a threshold voltage ($V_t$), or to reduce off-state leakage current ($I_{off}$) of an electronic device 100, or combinations thereof. Body doping 112 for an n-type metal-oxide-semiconductor (NMOS) electronic device 100 may comprise increasing p-type density in the gate region of multi-gate fin 110. Body doping 112 for a p-type metal-oxide-semiconductor (PMOS) electronic device 100 may comprise increasing n-type density in the gate region of multi-gate fin 110. In an NMOS embodiment, the body-doped 112 gate region of the multi-gate fin 110 comprises a p-type dopant such as, for example, boron (B). In a PMOS embodiment, the body-doped 112 gate region of the multi-gate fin 110 comprises an n-type dopant such as, for example, arsenic (As) or phosphorous (P). Other suitable dopants may be used in other embodiments.

Multi-gate fin 110 may be body-doped 112 after the sacrificial gate structure 108 is removed to increase body dopant uniformity in the multi-gate fin 110. Higher temperature operations may decrease body dopant uniformity by causing body dopant segregation. Thus, avoiding higher temperature operations that increase such body dopant segregation may increase body dopant uniformity of multi-gate fin 110. In an embodiment, higher temperature operations that may increase body dopant segregation of multi-gate fin 110 occur prior to removal of the sacrificial gate structure 108. Higher temperature operations that may cause body dopant segregation may include, but are not limited to, activation anneals for prior implant steps, deposition of sacrificial gate dielectric such as oxidation, or epitaxial growth operations performed on the electronic device 100. In an embodiment, higher temperature operations include operations that use a temperature greater than about 700° C.

Multi-gate fin 110 may comprise a tri-gate fin. In an embodiment, multi-gate fin 110 comprises a first surface, a second surface, and a third surface. First, second, and third surfaces of multi-gate fin 110 may be further described with respect to FIG. 2. In an embodiment, the first surface and the third surfaces are sidewalls of a tri-gate fin 110 that are substantially parallel to one another. In another embodiment, the second surface is a top surface of a tri-gate fin 110 wherein the second surface and the first surface are substantially perpendicular to one another.

The removal of sacrificial gate structure 108 may allow an angled implant to provide body doping 112. An angled implant for body doping 112 may increase body dopant uniformity in the multi-gate fin 110 by at least increasing the amount of body dopant received by the first and third surfaces or sidewalls compared with a vertical implant that approaches from a direction that is about normal to the second surface or top surface of multi-gate fin 110. Multi-gate fin 110 may be body-doped 112 at an angle, $\theta_{Imp}$, between about 10 degrees and about 80 degrees relative to the second surface of the multi-gate fin 110 or relative to the exposed surface of the semiconductor substrate 102, or combinations thereof. In another embodiment, first, second, and third surfaces of the multi-gate fin 110 are body-doped 112 at an angle between about 40 degrees and about 70 degrees relative to the second surface or relative to the exposed surface of the semiconductor substrate 102, or combinations thereof. Angled body doping 112 may be further described with respect to FIG. 2.

Angled implant for body-doping 112 and/or body-doping 112 after removal of a sacrificial gate structure 108 may increase body dopant uniformity in a multi-gate fin 110 of electronic device 100. Increasing body dopant uniformity may decrease short channel effects and/or increase threshold voltage ($V_t$) uniformity in an electronic device 100. Increasing body dopant uniformity may also reduce off-state leakage current ($I_{off}$) of an electronic device 100.

In an embodiment according to FIG. 1c, a subsequent gate structure 114 may be formed on the multi-gate fin 110. An electronic device 100 may comprise a semiconductor substrate 102, dielectric material 104, spacer structure 106, multi-gate fin 110, and subsequent gate structure 114, coupled as shown. Subsequent gate structure 114 may be coupled to the gate region of the multi-gate fin 110 and may refer to any gate structure 114 that is formed after the removal of sacrificial gate structure 108.

In an embodiment, an electronic device 100 comprises a semiconductor substrate 102, a multi-gate fin 110 coupled with the semiconductor substrate 102, the multi-gate fin 110 comprising a source region, a drain region, and a gate region wherein the gate region is disposed between the source region and the drain region, the gate region being body-doped 112 after a sacrificial gate structure 108 is removed from the multi-gate fin 110 and before a subsequent gate structure 114 is formed. Electronic device 100 may further comprise a dielectric material 104 coupled with the source region and the drain region of the multi-gate fin 110 and subsequent gate structure 114 coupled to the gate region of the multi-gate fin 110. In another embodiment, electronic device 100 may further comprise a spacer structure 106 coupled to the multi-gate fin 110, the spacer structure 106 being disposed between the dielectric material 104 and the subsequent gate structure 114.

Subsequent gate structure 114 may be formed on the multi-gate fin 110 by deposition of a subsequent gate dielectric to the multi-gate fin 110 and deposition of a subsequent gate electrode to the gate dielectric. Subsequent gate dielectric may comprise any suitable dielectric material including, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or combinations thereof. Other suitable dielectrics may be used in other embodiments. Subsequent gate electrode may comprise any suitable electrode material including, for example, gold, silver, platinum, copper, titanium, tantalum, palladium, nickel, cobalt, iron, or aluminum, or combinations thereof. Other suitable electrode materials may be used in other embodiments. In an embodiment, subsequent gate structure 114 comprises a subsequent gate dielectric coupled to the gate region of the multi-gate fin 110 and a subsequent gate electrode coupled to the gate dielectric.

Figure 2:
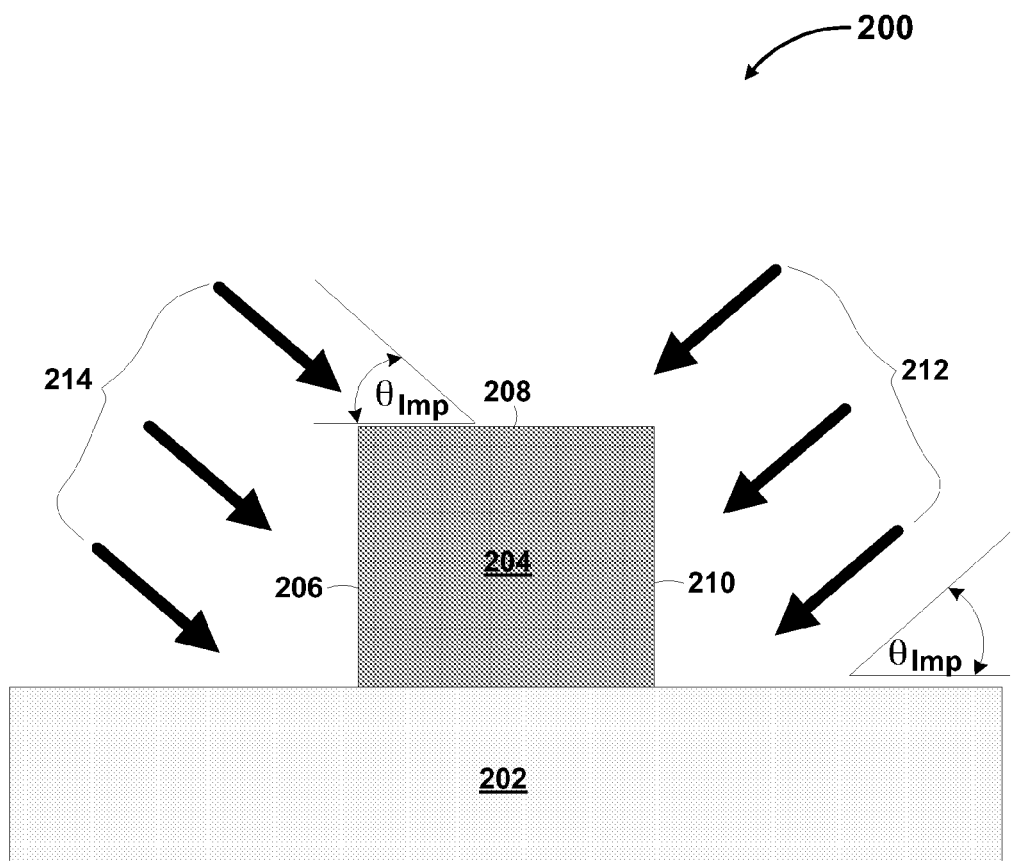
FIG. 2 is an elevation cross-section schematic of body doping a multi-gate electronic device, according to but one embodiment.

FIG. 2 is an elevation cross-section schematic of body doping a multi-gate electronic device, according to but one embodiment. FIG. 2 may be a cross-section of a gate region of a multi-gate fin 204 as depicted, for example, in FIG. 1b. In an embodiment, an electronic device 200 comprises a semiconductor substrate 202, a gate region of a multi-gate fin 204 having first 206, second 208, and third 210 surfaces, and body doping implant 212, 214.

Gate region of multi-gate fin 204 may be body-doped 212, 214 after a sacrificial gate structure is removed. Body-doping 212, 214 after a sacrificial gate structure is removed may increase body dopant uniformity in the multi-gate fin 204 by avoiding higher temperature operations that increase body dopant segregation.

In an embodiment, multi-gate fin 204 is a tri-gate fin. Multi-gate fin 204 may comprise a first surface 206, a second surface 208, and a third surface 210. The first surface 206 and third surface 210 may be sidewalls of multi-gate fin 204. The second surface 208 may be a top surface of multi-gate fin 204. In an embodiment, the first surface 206 and the third surface 210 are substantially parallel to one another. In another embodiment, the first surface 206 and the second surface 208 are substantially perpendicular to one another.

Gate region of multi-gate fin 204 may be body-doped 212, 214 at an angle, $\theta_{Imp}$, between about 10 degrees and about 80 degrees relative to the second surface 208 or relative to the exposed surface of the semiconductor substrate 202. In another embodiment, gate region of multi-gate fin 204 is body-doped 212, 214 at an angle, $\theta_{Imp}$, between about 40 degrees and about 70 degrees relative to the second surface 208 or relative to the exposed surface of the semiconductor substrate 202.

Several techniques may be employed to ensure that first surface 206, second surface 208, and third surface 210 receive body doping 212, 214. In one embodiment, a first body doping implant 212 approaches multi-gate fin 204 from a first angle to provide body doping to the third 210 and/or second surfaces 208. A second body doping implant 214 may approach multi-gate fin 204 from a second angle to provide body doping to the first 206 and/or second 208 surfaces. In another embodiment, a first body doping implant 212 and/or second body doping implant 214 are combined with a vertical implant or implants of other angles or angles that change over time to provide body-doping to first 206, second 208, and third 210 surfaces. Any other suitable method to provide body doping 212, 214 to the surfaces 206, 208, 210 of multi-gate fin may be used in other embodiments. In an embodiment, electronic device 200 includes embodiments already described with respect to FIG. 1.

Figure 3:
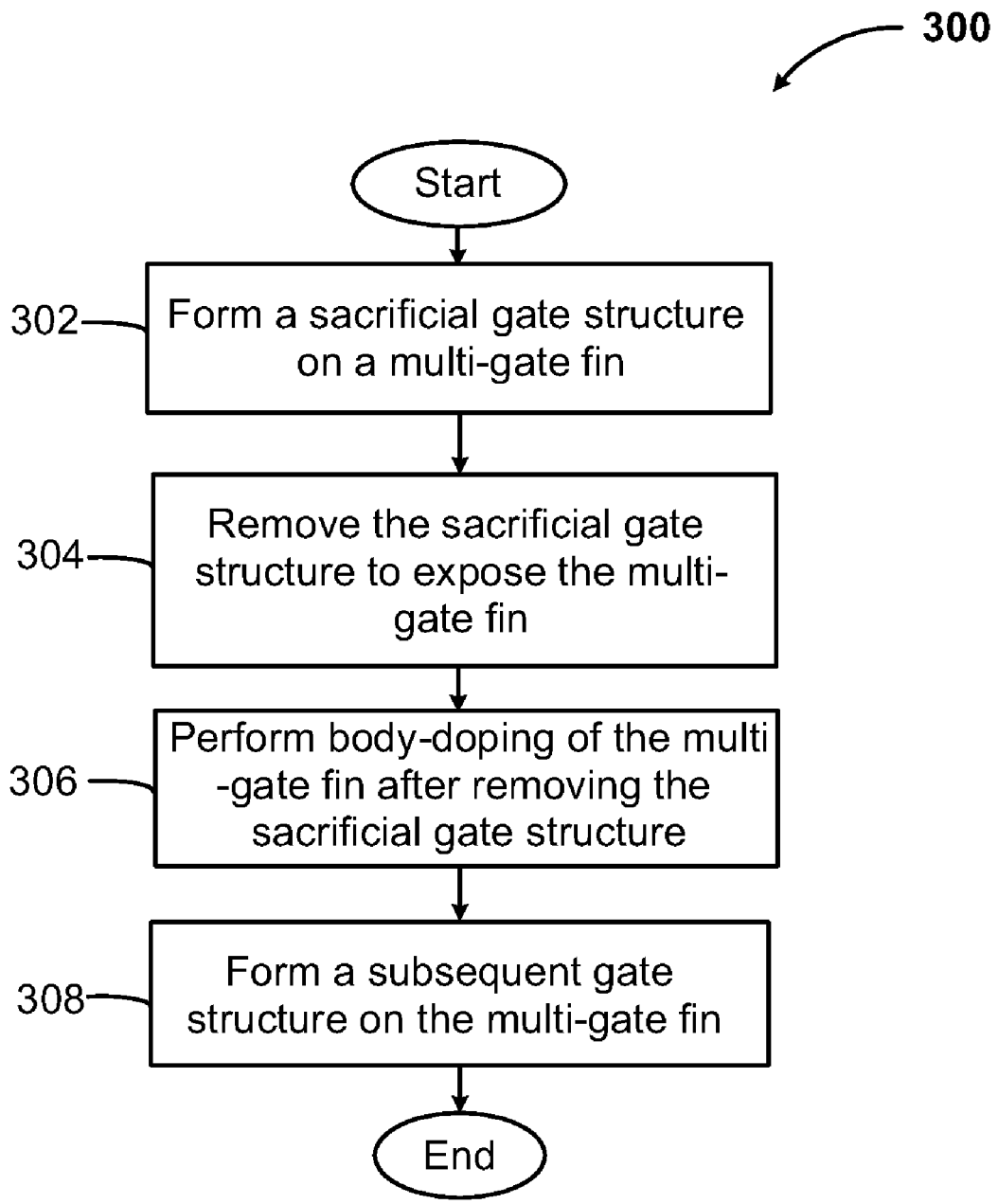
FIG. 3 is a flow diagram of a method for increasing body dopant uniformity in a multi-gate electronic device, according to but one embodiment.

FIG. 3 is a flow diagram of a method for increasing body dopant uniformity in a multi-gate electronic device, according to but one embodiment. In an embodiment, a method 300 includes forming a sacrificial gate structure on a multi-gate fin at box 302, removing the sacrificial gate structure to expose the multi-gate fin at box 304, and body doping the multi-gate fin after removing the sacrificial gate structure at box 306. The multi-gate fin may be coupled with a semiconductor substrate. Method 300 may further include forming a subsequent gate structure on the multi-gate fin at box 308.

Forming a sacrificial gate structure on a multi-gate fin 302 may comprise depositing a sacrificial gate dielectric to the multi-gate fin and depositing a sacrificial gate electrode to the sacrificial gate dielectric. A sacrificial gate electrode may include any suitable gate electrode material. In an embodiment, a sacrificial gate electrode comprises polysilicon. A sacrificial gate dielectric may include any suitable gate dielectric material including, for example, oxide. Deposition of sacrificial gate dielectric or sacrificial gate electrode may be accomplished by any suitable deposition method including chemical vapor deposition (CVD), physical vapor deposition (PVD), atomic layer deposition (ALD), epitaxial deposition methods, oxide growth, or any other suitable method.

Forming a sacrificial gate structure on a gate region of a multi-gate fin 302 may further comprise depositing a dielectric material to source and drain regions of the multi-gate fin, and forming a spacer structure between the sacrificial gate structure and the dielectric material. The multi-gate fin may be formed in a semiconductor substrate. In an embodiment, the semiconductor substrate may comprise silicon (Si). In other embodiments, the semiconductor substrate includes any suitable semiconductor material for fabricating a multi-gate electronic device. The dielectric material may comprise silicon oxide ($SiO_2$) in an embodiment. In other embodiments, the dielectric material includes any suitable dielectric material for fabricating a multi-gate electronic device. The spacer structure may comprise silicon nitride (SiN) in an embodiment. In other embodiments, the spacer structure includes any suitable spacer material for fabricating a multi-gate electronic device. Removing the sacrificial gate structure 304 may be accomplished by any suitable method including for example, lithography and/or etch processes.

Body doping the multi-gate fin 306 may be performed after removing the sacrificial gate structure to increase body dopant uniformity in the multi-gate fin by avoiding higher temperature operations or without involving higher temperature operations. Higher temperature operations may decrease body dopant uniformity by increasing body dopant segregation. Thus, avoiding higher temperature operations that increase such body dopant segregation may increase body dopant uniformity of a multi-gate fin. In an embodiment, higher temperature operations that may increase body dopant segregation of multi-gate fin occur prior to removing the sacrificial gate structure 304. Higher temperature operations that may cause body dopant segregation may include, but are not limited to, activation anneals for prior implant steps, deposition of sacrificial gate dielectric such as oxidation, or epitaxial growth operations performed on an electronic device incorporating the multi-gate fin. In an embodiment, higher temperature operations include operations that use a temperature greater than about 700° C.

Body doping 306 may comprise an angled implant in one or more embodiments. A multi-gate fin may comprise a first surface, a second surface, and a third surface wherein the first surface and the third surface are substantially parallel to one another and wherein the first surface and the second surface are substantially perpendicular to one another. In an embodiment, body doping 306 comprises an angled implant between about 10 degrees and about 80 degrees relative to the second surface. In another embodiment, body doping 306 comprises an angled implant between about 40 degrees and about 70 degrees relative to the second surface.

Body doping 306 may be accomplished by a variety of techniques to ensure that the first, second, and third surfaces receive body doping. In one embodiment, a first body doping implant approaches the multi-gate fin from a first angle to provide body doping to the third and/or second surfaces of the multi-gate fin. A second body doping implant may approach multi-gate fin from a second angle to provide body doping to the first and/or second surfaces. In another embodiment, a first body doping implant and/or second body doping implant are combined with a vertical implant, or implants of other angles, or angles that change over time to provide body-doping to the first, second, and third surfaces of the multi-gate fin. Any other suitable method to provide body doping to the surfaces of a multi-gate fin may be used in other embodiments. In an embodiment, the body doping 306 is performed such that at least the first surface, the second surface, and the third surface receive the body doping.

Body doping 306 may be used to set a threshold voltage ($V_t$), or to reduce off-state leakage current ($I_{off}$) of an electronic device, or combinations thereof. Body doping 306 for an n-type metal-oxide-semiconductor (NMOS) electronic device may comprise increasing p-type density in the gate region of multi-gate fin. Body doping 306 for a p-type metal-oxide-semiconductor (PMOS) electronic device may comprise increasing n-type density in the gate region of multi-gate fin. In an NMOS embodiment, the gate region of the multi-gate fin is body-doped 306 with a p-type dopant such as, for example, boron (B). In a PMOS embodiment, the gate region of the multi-gate fin is body-doped 306 with an n-type dopant such as, for example, arsenic (As) or phosphorous (P). Other suitable dopants may be used in other embodiments.

Forming a subsequent gate structure on the multi-gate fin 308 may comprise depositing a subsequent gate dielectric to the multi-gate fin and depositing a subsequent gate electrode to the gate dielectric. Deposition actions associated with forming a subsequent gate structure 308 may be accomplished by any suitable deposition method including chemical vapor deposition (CVD), physical vapor deposition (PVD), atomic layer deposition (ALD), epitaxial deposition methods, oxide growth, or any other suitable method. In an embodiment, a subsequent gate dielectric comprises any suitable dielectric material including, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or combinations thereof. Other suitable dielectrics may be used in other embodiments. In another embodiment, a subsequent gate electrode comprises any suitable electrode material including, for example, gold, silver, platinum, copper, palladium, nickel, cobalt, iron, or aluminum, or combinations thereof. Other suitable electrode materials may be used in other embodiments.

Method 300 and associated actions may further include other semiconductor fabrication processes such as lithography, etch, thin films deposition, planarization, diffusion, metrology, or any other associated action with semiconductor fabrication. In one or more embodiments, method 300 includes embodiments already described with respect to FIGS. 1-2.

Various operations may be described as multiple discrete operations in turn, in a manner that is most helpful in understanding the claimed subject matter. The order of description should not, however, be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 4:
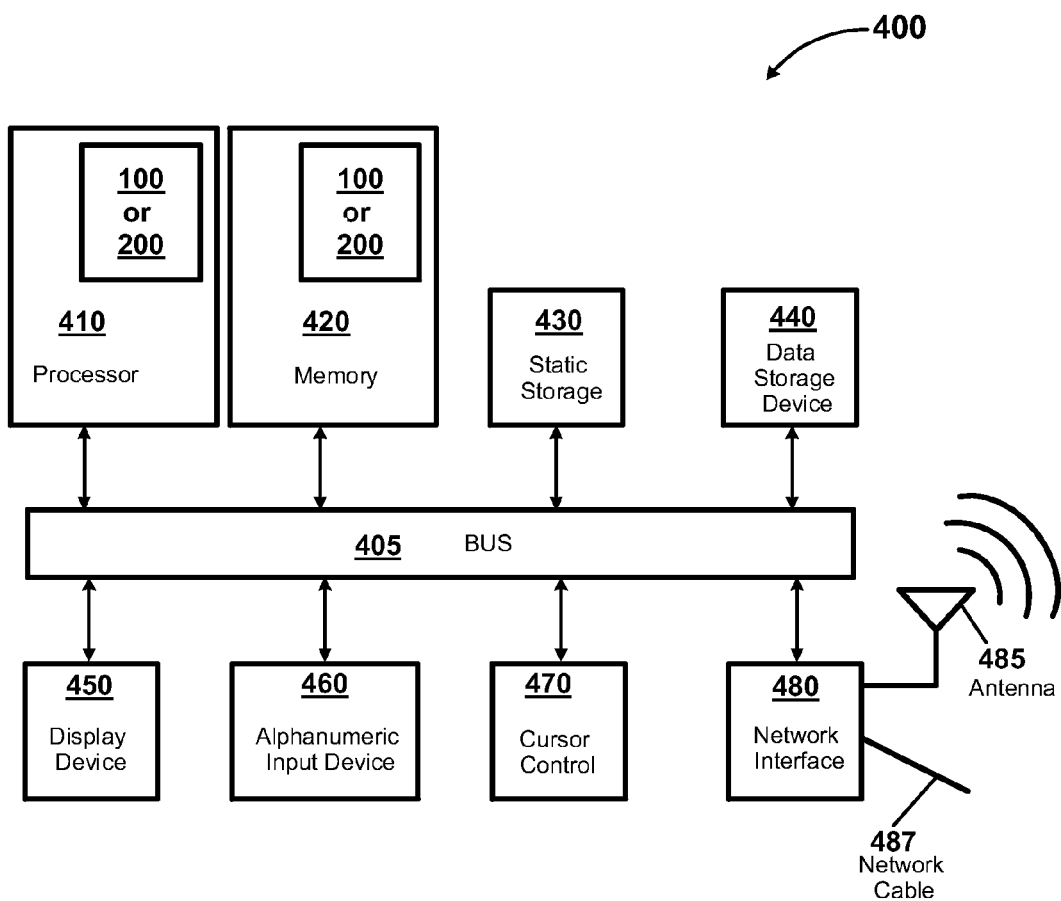
FIG. 4 is a diagram of an example system in which an electronic device as described herein may be used, according to but one embodiment.

FIG. 4 is a diagram of an example system in which an electronic device as described herein may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes an electronic device 100, 200 as described herein. In an embodiment an electronic device 100, 200 as described herein is part of an electronic system's processor 410 or memory 420. Electronic system 400 may include a processor 410 and memory 420 coupled with the processor 410, wherein the processor 410 or the memory 420, or combinations thereof, comprise one or more electronic devices 100, 200 as described herein. In an embodiment, electronic devices 100, 200 comprise one or more multi-gate transistor devices. In an embodiment, the processor 410 or the memory 420, or combinations thereof, comprise a p-type metal-oxide-semiconductor (PMOS) electronic device 100, 200 as described herein or an n-type metal-oxide-semiconductor (NMOS) an electronic device 100, 200 as described herein.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes an electronic device 100, 200 in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes an electronic device 100, 200 as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus comprising:
a semiconductor substrate;
a multi-gate fin coupled with the semiconductor substrate, the multi-gate fin comprising a source region, a drain region, and a gate region wherein the gate region is disposed between the source region and the drain region, the gate region being body-doped after higher temperature operations on the apparatus have been performed and a sacrificial gate structure is removed from the multi-gate fin, and before a subsequent gate structure is formed;
a dielectric material coupled with the source region and the drain region of the multi-gate fin; and
the subsequent gate structure coupled to the gate region of the multi-gate fin.

2. An apparatus according to claim 1, wherein the gate region of the multi-gate fin is body-doped after the sacrificial gate structure is removed to increase body dopant uniformity in the multi-gate fin by avoiding higher temperature operations that increase body dopant segregation, the higher temperature operations comprise temperatures greater than about 700° C.

3. An apparatus according to claim 1, wherein the multi-gate fin comprises a first surface, a second surface, and a third surface wherein the first surface and the third surface are substantially parallel to one another and wherein the first surface and the second surface are substantially perpendicular to one another, wherein the gate region of the multi-gate fin is body-doped at an angle between about 10 degrees and about 80 degrees relative to the second surface.

4. An apparatus according to claim 3, wherein the first surface, the second surface, and the third surface of the multi-gate fin are body-doped at an angle between about 40 degrees and about 70 degrees relative to the second surface.

5. An apparatus according to claim 1, wherein the body-doped gate region of the multi-gate fin comprises an n-type dopant for a p-type metal-oxide-semiconductor (PMOS) device or wherein the body-doped gate region of the multi-gate fin comprises a p-type dopant for an n-type metal-oxide-semiconductor (NMOS) device.

6. An apparatus according to claim 1, further comprising:
a spacer structure coupled to the multi-gate fin, the spacer structure being disposed between the dielectric material and the subsequent gate structure.

7. An apparatus according to claim 1, wherein the subsequent gate structure comprises:
a subsequent gate dielectric coupled to the gate region of the multi-gate fin; and
a subsequent gate electrode coupled to the gate dielectric.

* * * * *